(12) United States Patent
Lee

(10) Patent No.: US 11,430,778 B2
(45) Date of Patent: Aug. 30, 2022

(54) DIFFERENTIAL TRENCH FILL FOR EASE OF LAYOUT DESIGN

(71) Applicant: Intel Corporation, Santa Clara, CA (US)

(72) Inventor: Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 653 days.

(21) Appl. No.: 16/354,741

(22) Filed: Mar. 15, 2019

(65) Prior Publication Data

US 2020/0294986 A1 Sep. 17, 2020

(51) Int. Cl.
*H01L 27/02* (2006.01)
*H01L 21/768* (2006.01)

(52) U.S. Cl.
CPC ...... *H01L 27/0207* (2013.01); *H01L 21/7684* (2013.01); *H01L 21/76877* (2013.01)

(58) Field of Classification Search
CPC ............. H01L 27/0207; H01L 21/7684; H01L 21/76877; H01L 29/42312
See application file for complete search history.

(56) References Cited

U.S. PATENT DOCUMENTS

2019/0273047 A1* 9/2019 Yang ................. H01L 21/76849

* cited by examiner

*Primary Examiner* — Karen Kusumakar
(74) *Attorney, Agent, or Firm* — Schwabe, Williamson & Wyatt P.C.

(57) ABSTRACT

An integrated circuit structure comprises a plurality of structures above a substrate, wherein spacing between the structures creates a range of different open density regions from a relatively low open density region to a high open density region. A first fill material fills at least a portion of openings between the structures in at least the high open density region to provide a substantially uniform open density across the different open density regions, wherein the first fill material is patterned to include openings therein. A second fill material fills the openings between the structures in the low open density region, and fills the openings in the first fill material in the at least the high open density region.

25 Claims, 12 Drawing Sheets

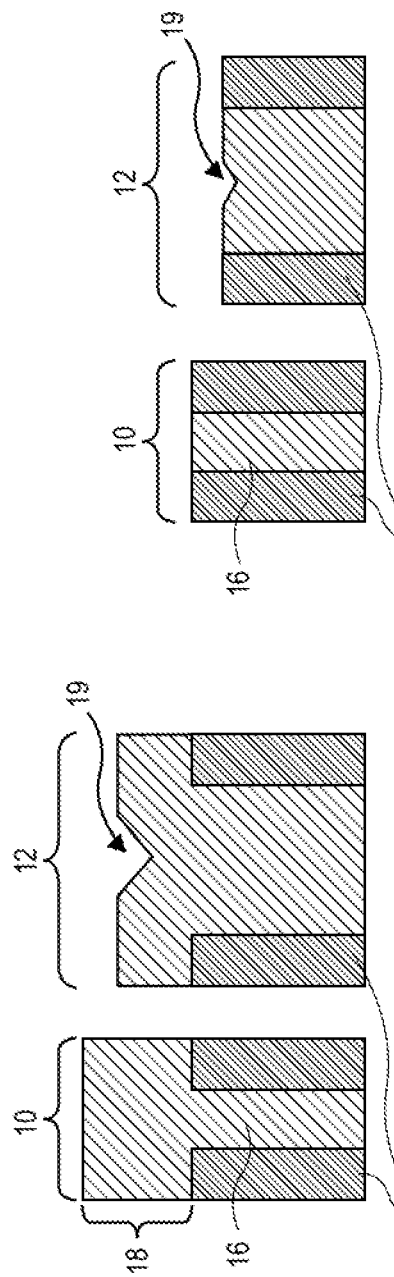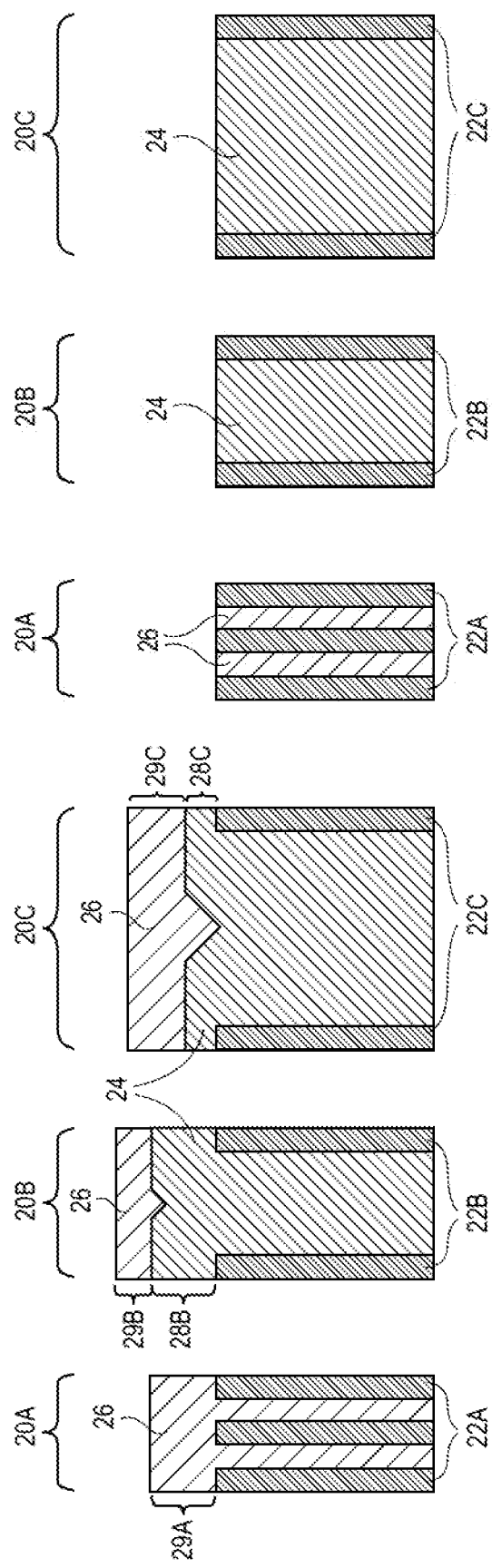
FIG. 1A  FIG. 1B  FIG. 2A  FIG. 2B

US 11,430,778 B2

DIFFERENTIAL TRENCH FILL FOR EASE OF LAYOUT DESIGN

TECHNICAL FIELD

Embodiments of the disclosure are in the field of integrated circuit structures and, in particular, differential trench fill for ease of layout design.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 1A and 1B are diagrams illustrating cross-section views of a portion of an IC showing an example low open density region and high open density region.

FIGS. 2A and 2B are diagrams illustrating cross-section views of a portion of an IC showing an example range of open density regions.

DESCRIPTION OF THE EMBODIMENTS

Figure 3A:
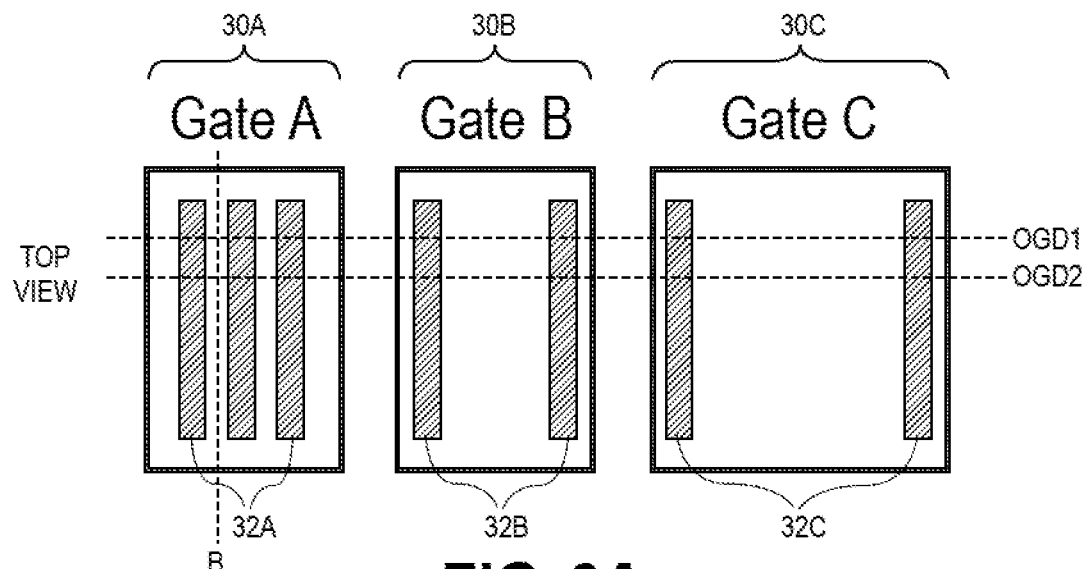
FIGS. 3A-3D are diagrams of various views of a portion of an IC showing the differential trench fill fabrication process used in a replacement gate process in which two layers of conductive fill material are to fill the trenches between a plurality spacers in three types of gate regions, Gate A, Gate B and Gate C.

Differential trench fill for ease of layout design is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for a differential trench fill for ease of layout design. Embodiments may include or pertain to one or more of replacement gate, damascene, dual damascene, and generally to any type of material fill process during semiconductor fabrication.

To provide context, a conventional method of fabricating conductive structures in an integrated circuit (IC) is to form open regions over a substrate or wafer and to deposit a conductive material in the open regions to form the conductive structure. For example, to form an interconnect, a dielectric layer is deposited and etched to form a pattern of trenches (and/or vias). Next, a conductive material is deposited into the trenches to form interconnects. Another example is the formation of a transistor gate stack that includes a gate electrode and a gate dielectric formed over one or more fins to define the channel regions. Such a gate stack may be fabricated using a replacement gate process in which a dummy gate is deposited and patterned over fins, and spacers are formed adjacent on both sides of the dummy gate. An insulating material is deposited over the dummy gate and spacers, and the dummy gate is removed, leaving openings or trenches between the spacers that expose the channel regions of the transistors. The dummy gate material removed from the openings is then replaced with, for example, a high-k dielectric and a replacement metal gate material to form the gate stack.

After a conductive material is deposited into the open regions, the conductive material that lies above the surface of the dielectric layer is referred to as overburden and is removed through a chemical-mechanical polishing (CMP) process. CMP is used to planarize a variety of materials used in semiconductor integrated circuit (IC) devices. For example, CMP is used to polish dielectric layers such as silicon dioxide, and metal layers such as tungsten, aluminum and copper. Regardless of the material being polished, similar polishing techniques are used to remove the excess conductive material above the dielectric layer while obtaining a planar surface.

Due to the layout design of the components comprising an IC, a wide range of pattern densities may exist. For example, different regions of the IC may have different open densities based on the amount of open space between structures defining the open regions. Different size openings to be filled with the conductive material require different amounts of fill material.

FIGS. 1A and 1B are diagrams illustrating cross-section views of a portion of an IC showing an example low open density region 10 and a high open density region 12. FIG. 1A shows a conductive fill material 16 deposited in openings of both the low open density region 10 and the high open density region 12 before polishing. The low open density region 10 corresponds to a structure having a narrow opening defined by sidewalls of a border material 14, and hence, the structure has a low amount of open space between the sidewalls of the border material 14. High open density region 12 corresponds to a structure having a wide opening defined by sidewalls of the border material 14, and hence, a high amount of open space between the sidewalls of the border material 14 relative to the low density region 10. The border material 14 may comprise any type dielectric or spacer material or substrate, for example.

Referring to FIG. 1A, the excess amount of the conductive fill material 16 above the top surface of the border material 14 is referred to as an overburden 18. Conductive fill material 16 deposited in regions having different open densities behave differently. For example, there may be a slight difference in height of the overburden 18 relative to a surface of the border material 14 in the low open density region 10 compared to the high open density region 12. As the conductive fill material 16 is deposited by chemical vapor deposition (CVD) or atomic layer deposition (ALD), the higher open density region 12 has less overburden due to the additional fill volume required. Due to the size of the opening, deposition of the conductive fill material 16 in the high open density region 12 results in an indentation 19 in the surface of the conductive fill material 16 near the center of the high open density region 12, as shown.

FIG. 1B shows the low open density region 10 and the high open density region 12 after the polishing (i.e., planarization) process to remove the overburden. Polishing of the low open density region 10 results in a substantially planar surface across the border material 14 and the conductive fill material 16. Polishing the high open density region 12, however, results in removal of more of the conductive fill material 16 due to less overburden 18 in the high open density region 12. The result is that the indentation 19 remains in the conductive fill material 16 after polishing compared to the surface of the border material 14, which is referred to as dishing. As a result, the topography of the substrate or wafer between high open density regions and low open density regions varies, resulting in a non-planar surface. A planarization process for the conductive fill material 16 has a lower polish rate on the boarder material 14. As the high open density region 12 has less stopping material to slow down the polish, more stack height loss occurs compared to the low open density region 10.

One common approach to solve this problem is making the thickness of the overburden 18 similar for low open density regions 10 and the high open density regions 12 by patterning and etching the overburden material in the low open density region 10 before the polishing process. The pattern and etch approach can generate a certain delta of height of the overburden material for different regions. However, the amount of overburden material that can be etched is fixed value and thus will not work if the IC layout contains a wide range of different open density regions. For layouts having a wide range of opening density regions, it is challenging to achieve a desired conductive fill height for all structures with single patterning step. Differences in stack height/planarity across a substrate due to erosion of the conductive material in high open density regions is disadvantageous for ICs.

In accordance with one or more embodiments described herein, IC device features and structures are fabricated by a differential trench fill process. The differential trench fill process deposits two layers of fill material, whereby after the first fill material layer is patterned and etched across a plurality of features/regions, a desired open density is tuned for different open density regions using the second fill material layer that is deposited to achieve substantially similar overburden across the open density regions. An IC fabricated using such an architecture and process may exhibit a similar wafer topography across a range of different open density regions resulting in a substantially planar surface. Applications of such systems may include, but are not limited to, front end (FEOL) and back end (BEOL) logic, memory, or analog applications. Embodiments described herein may include planar or non-planar IC features and structures that require planarized fill materials.

FIGS. 2A and 2B are diagrams illustrating cross-section views of a portion of an IC showing an example range of open density regions over a substrate. FIG. 2A shows that the IC comprises a layout having a plurality of structures 22A, 22B and 22C (collectively referred to as structures 22) above a substrate (not shown), wherein spacing between the structures 22 creates a range of different open density regions 20A, 20B, and 20C (collectively referred to as open density regions 20) from a relatively low open density region to a high open density region. For example, the IC may include a first set of structures 22A comprising a low open density region 20A, a second set of structures 22B comprising a medium open density region 20B, and a third set of structures 22C corresponding to a high open density region 20C.

According to the differential trench fill process of the disclosed embodiments, a first fill material 24 is deposited over the substrate and then patterned and etched to fill at least a portion of the openings between the structures 22 in at least the high open density region 20C to provide a substantially uniform open density across the different open density regions 20. In one embodiment, the first fill material 24 is deposited over any open density region having an open density of at least 50%. For example, the first fill material 24 may be patterned to fill the openings between the structures 22B and 22C in both the medium open density region 20B and the high open density region 20C so that the different open density regions 20 have a substantially uniform open density across the substrate. In one embodiment, the first fill material 24 may be patterned to include openings or gaps therein, as described further below. For example, the first fill material 24 may be patterned into parallel spaced strips that are formed across the openings formed by the structures. As shown in FIG. 2A, prior to polishing, the first fill material 24 creates a first overburden 28B and 28C (collectively referred to as first overburden 28) over the structures 22B and 22C in the medium open density region 20B and the high open density region 20C, respectively.

In one example, the structures 22 may comprise spacers that define a gate region in a replacement gate process, and the first fill material 24 and the second fill material 26 may comprise a conductive fill material, such as a work function metal, to form the gates. In this embodiment, the first overburden of first fill material 24 and the second overburden of second fill material 26 may be approximately 50-300 nm in height depending on the open density of the region.

After the first fill material 24 provides a substantially uniform open density to the open density regions 20, a second fill material 26 is formed over the substrate to fill the openings between the structures 22A in the low open density region 20A, and to fill the openings in the first fill material 24 in at least the high open density region 20C. For example, in one embodiment the second fill material 26 fills the openings in the first fill material 24 in both the medium open density region 20B and the high open density region 20C. According to one aspect of the disclosed embodiments, the thickness of the second fill material 26 is tuned to provide sufficient overburden for planarization.

As shown in FIG. 2A, the second fill material 26 creates a second overburden 29A 29B and 29C (collectively referred to as overburden 29) over the structures 22A in the low open density region 20A, and over the first overburden 28B of the first fill material 24 in the medium open density region 20B and the high open density region 20C, respectively. According to the disclosed embodiments, the total overburden (first overburden 28B and 28C plus the second overburden 29A, 29B and 29C) is uniform across structures 22 with different opening densities. The total overburden includes the first and second overburden materials above the structures 22.

FIG. 2B shows the low open density region 20A, the medium open density region 20B, and the high open density region 20C after polishing. Due to the substantially uniform open density for all the open density regions 20 across the substrate provided by the first fill material 24 and the second fill material 26, the polishing process results in substantially planarity across the structures 22 filled with the first and second fill materials 24 and 26 in the different open density regions 20 to achieve a desired final height. For example, in one embodiment the first fill material 24 and the second fill material 26 may be tuned to provide the same final heights for the structures 22 in the different open density regions 20. In an alternative embodiment, the first fill material 24 and the second fill material 26 may be tuned to provide different final heights for the structures 22 in the different open density regions 20.

In the example where the structures 22 comprise spacers used to form transistor gates, the polishing may result in the spacers, the first fill material 24, and the second fill material 26 being substantially planar and approximately 50-300 nm in height.

In one embodiment, the first fill material 24 and the second fill material 26 may comprise a conductive fill material, such a work function metal, e.g., tungsten, aluminum and copper. In an alternative embodiment, the first fill material 24 and the second fill material 26 may comprise a non-conductive fill material (e.g., an insulator or dielectric) for other types of structures. In one embodiment, the first fill material 24 and the second fill material 26 may comprise the same or different materials.

Figure 3B:
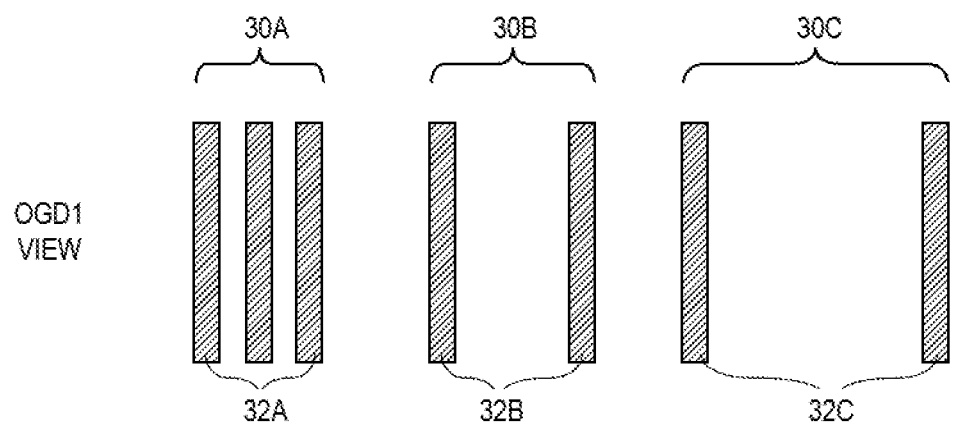
Figure 3C:
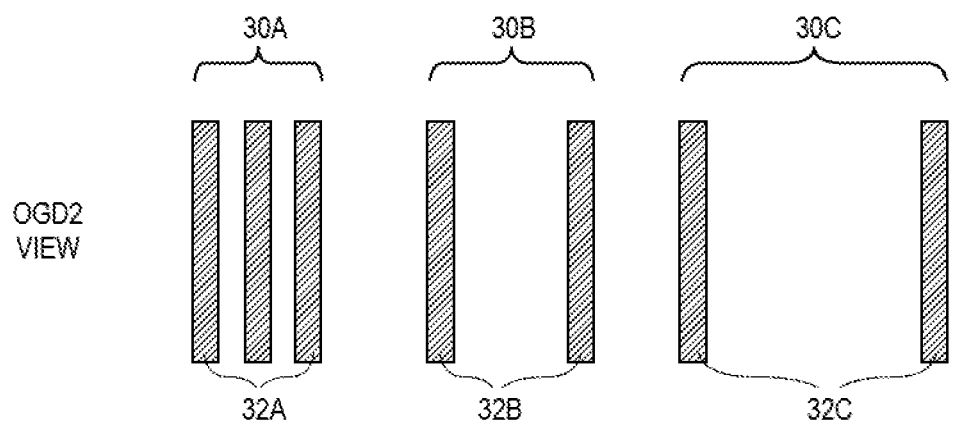
Figure 3D:
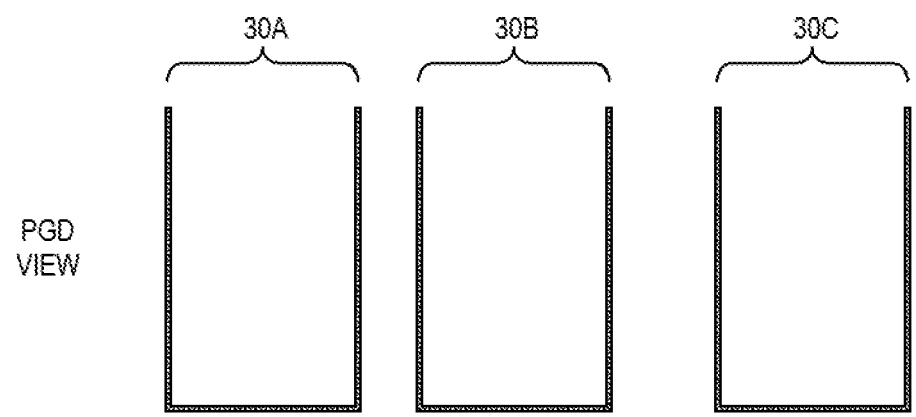

FIGS. 3A-3D are diagrams of various views of a portion of an IC showing the differential trench fill fabrication process used in a replacement gate process in which two layers of conductive fill material will fill the trenches between a plurality spacers in three types of gate regions, Gate A, Gate B and Gate C. FIG. 3A is a top view of the three gate regions. FIG. 3B is a first orthogonal-to-gate view of the gate regions along the horizontal cross-section line OGD1. FIG. 3C is a second orthogonal-to-gate view of the gate regions along the horizontal cross-section line OGD2. FIG. 3D is a parallel-to-gate (PGD) view of the gate regions along the vertical cross-section line B.

Individual gates are to be formed in trenches formed between the spacers 32A, 32B and 32C (collectively referred to as spacers 32) above a substrate, including one or more intervening material layers (not shown). The distance between the spacers 32 in the different gate regions creates a range of different open density regions 30A, 30B, and 30C (collectively referred to as open density regions 30) from a relatively low open density region to a high open density region. For example, the IC may include a first set of spacers 32A corresponding a low open density region 30A, a second set of spacers 32B corresponding a medium open density region 30B, and a third set of spacers 32C corresponding to a high open density region 30C.

FIGS. 4A-4D are diagrams illustrating cross-section views of the IC showing the differential trench fill fabrication process after a single patterning process deposits and etches a first conductive fill material 40 differently in the different open density regions 30 to form different patterns over the gate regions. As shown, the first conductive fill material 40 is etched such that an increasingly larger amount of the first conductive fill material 40 is patterned over increasingly higher open density regions 30. For example, after the first conductive fill material 40 is deposited over the substrate, the single patterning process patterns the first conductive fill material 40 so that the total density of the spacers 32 plus the first conductive fill material 40 of each gate region is substantially uniform.

Since the open density region 30A of Gate A is the lowest, the single patterning step completely removes the first conductive fill material 40 from the open density region 30A of Gate A. The single patterning process leaves an amount of the first conductive fill material 40 in the medium open density region 30B to make the total density of the medium open density region 30B substantially equal to low open density region 30A. More of the first conductive fill material 40 is kept in the higher open density regions 30 to compensate for the open density and to provide uniform open density across the different open density regions 30. Stated differently, the single patterning process leaves an amount of the first conductive fill material 40 in the high open density region 30C to make the total density of the high open density region 30C substantially equal to low and medium open density regions 30A and 30B.

Figure 4A:
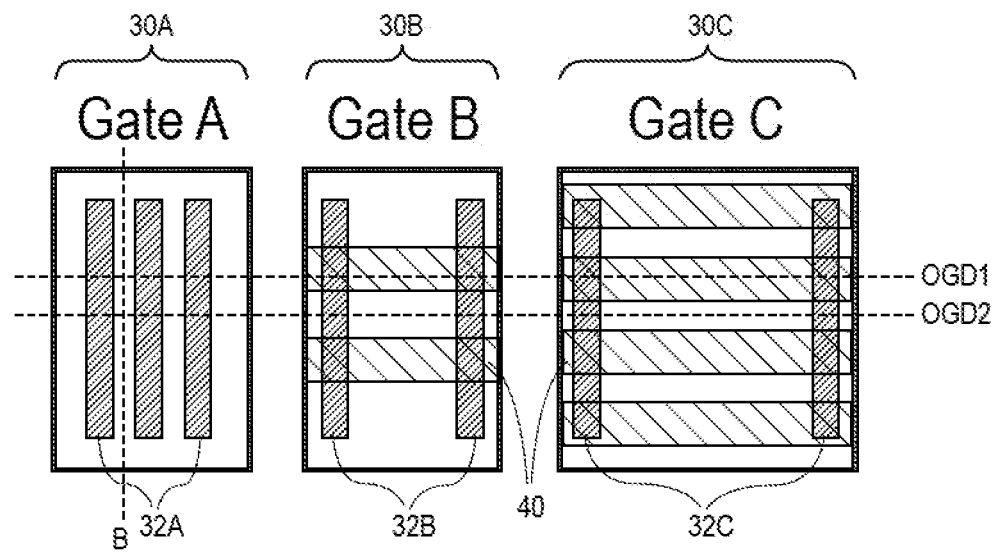
FIGS. 4A-4D are diagrams illustrating cross-section views of the IC showing the differential trench fill fabrication process after a single patterning process deposits and etches a first conductive fill material differently in the different open density regions to form different patterns over the gate regions.
Figure 4B:
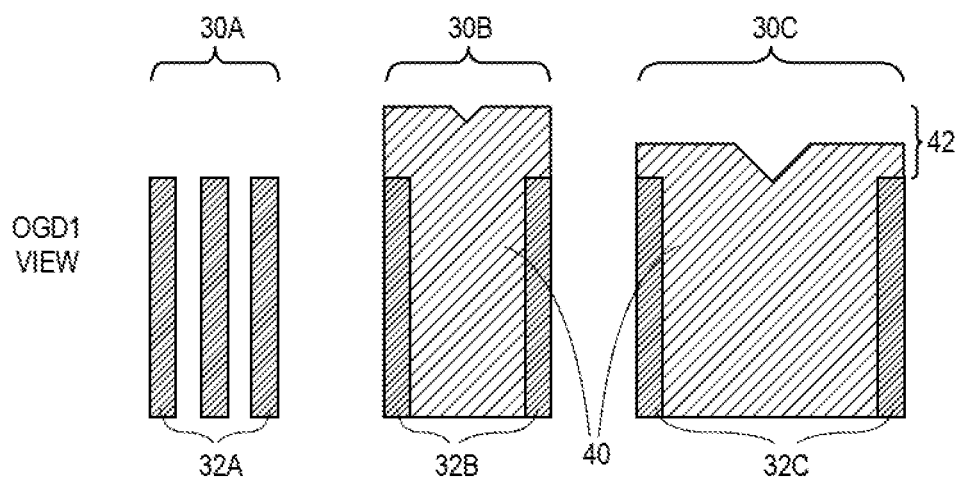
Figure 4C:
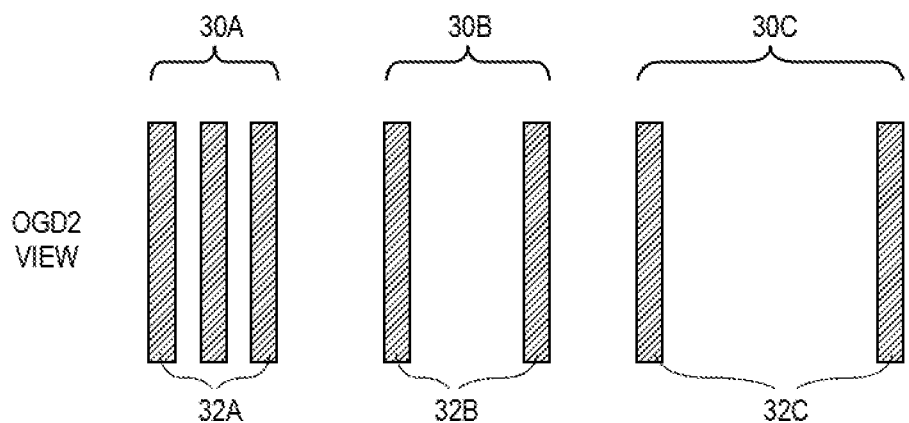
Figure 4D:
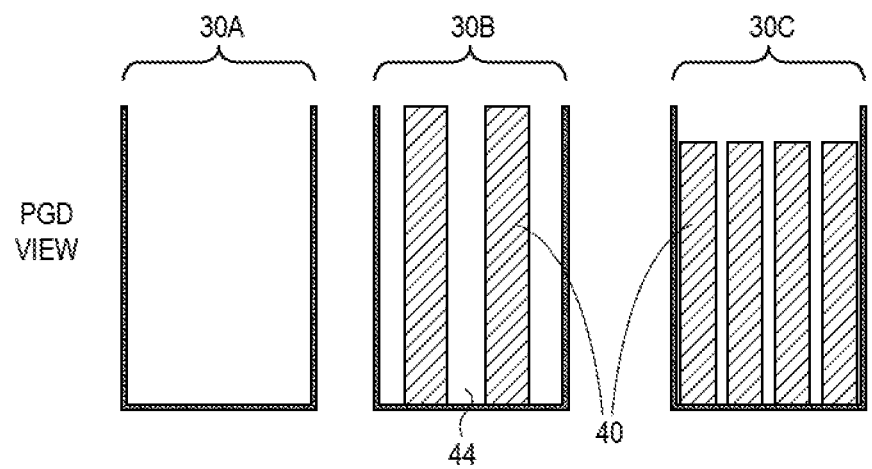

In the example of FIGS. 4A-4D, the result of the single patterning of the first conductive fill material 40 is shown. FIG. 4A shows two separate strips of the first conductive fill material 40 are patterned to fill the trench formed between spacers 32B, and four separate strips of the first conductive fill material 40 are patterned to fill the trench formed between spacers 32C. FIG. 4B shows the overburden 42 of the first conductive fill material 40 above the spacers 32B, where the overburden in open density region 30B is higher than the overburden in open density region 30C due to the narrower trench between spacers 32B. FIG. 4C shows a OGD2 view that lies between the strips of the first conductive fill material 40 and the first conductive fill material 40 thus is not visible. FIG. 4D shows trenches 44 that remain between the strips of the first conductive fill material 40 after the single patterning process.

Figure 5A:
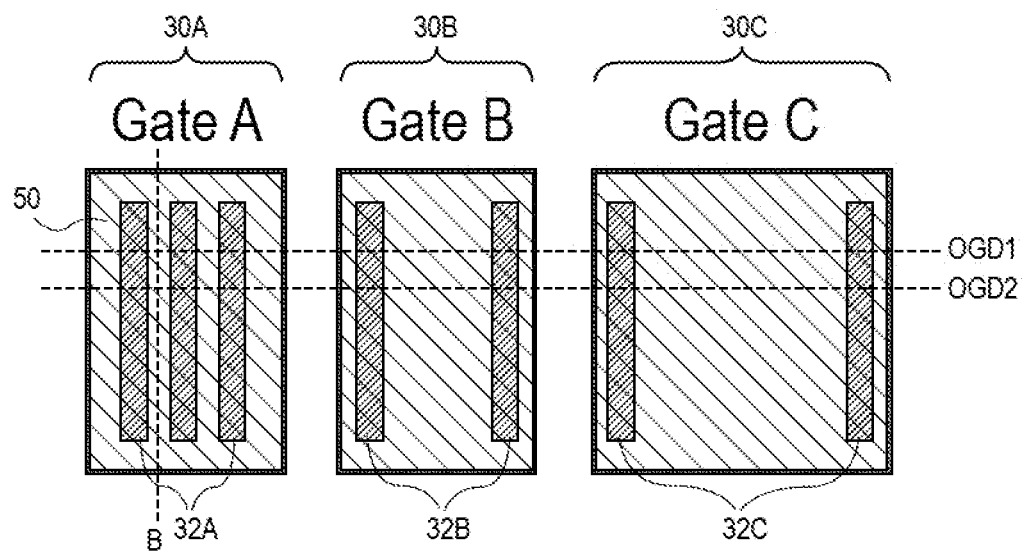
FIGS. 5A-5D are diagrams illustrating cross-section views of the IC showing the differential trench fill fabrication process after a second conductive fill material is formed over the gate regions that now have a uniform overburden provided by the first conductive fill material.

FIGS. 5A-5D are diagrams illustrating cross-section views of the IC showing the differential trench fill fabrication process after a second conductive fill material 50 is formed over the gate regions that now have a uniform total overburden (combining overburden 42 and 52 in FIGS. 5B-5D) provided by the first conductive fill material 40 and the second conductive fill material 50. FIG. 5A shows that in one embodiment, the second conductive fill material 50 is formed by conformally depositing the second conductive fill material 50 over all the open density regions 30, as shown. Since open density region 30A has no first conductive fill material 40, open density region 30A only includes the second conductive fill material 50 formed over all open spaces and spacers 32A.

Figure 5B:
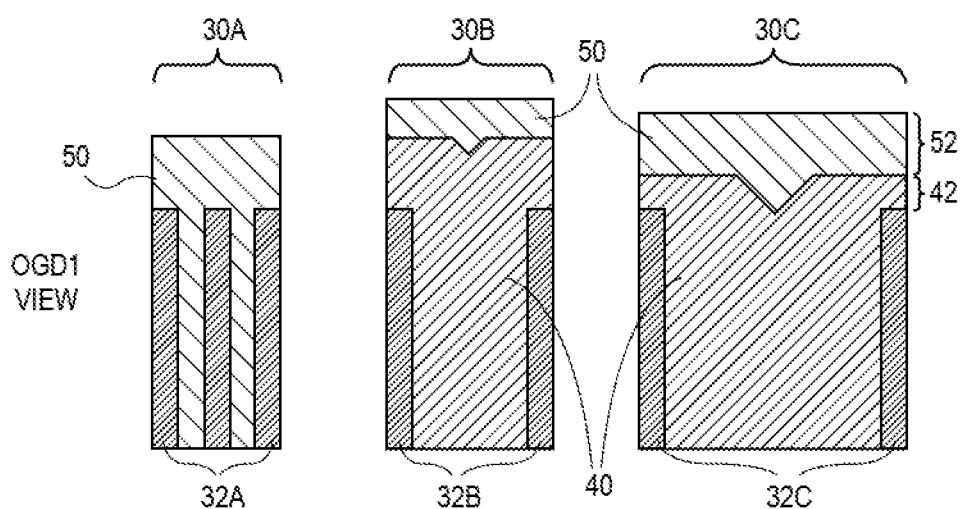
Figure 5C:
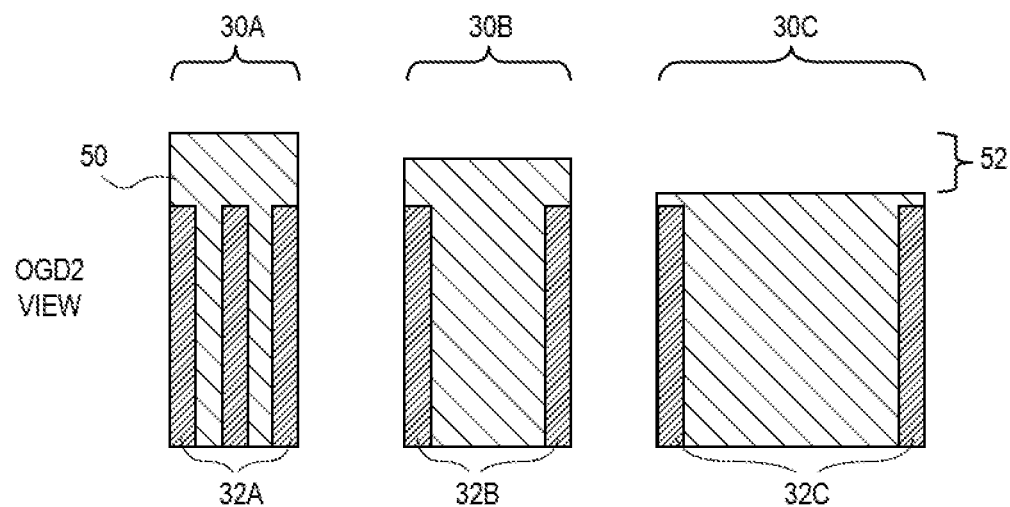
Figure 5D:
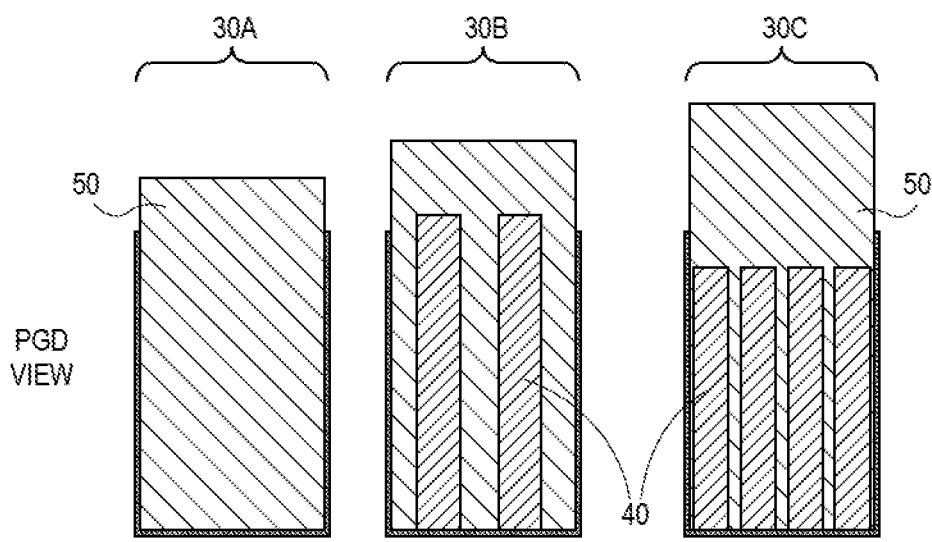

FIG. 5B shows that open density regions 30B and 30C have the second conductive fill material 50 formed over the strips of the first conductive fill material 40 and in the trenches 44 (FIG. 4C) between the strips of the first conductive fill material 40. FIG. 5B also shows the overburden of the first conductive fill material 42 plus the over burden 52 of the second conductive fill material 50. FIG. 5C shows a view of the second conductive fill material occupying spaces between the strips of the first conductive fill material 40. FIG. 5D shows the PGD view and strips of the first conductive fill material 40 under the second conductive fill material 50 in 30B and 30C. Cross-sectional transmission electron microscope (XTEM) specimens of the IC (or any other suitable detection tool) can detect the use of the differential trench fill process that utilizes two different fill materials and one patterning step to provide substantially planar surfaces for a range of open density regions across a substrate. For example, even in the embodiment where the first fill material 24 and the second fill material 26 of FIG. 2A may comprise the same materials, the XTEM can identify a grain boundary between the two different material layers across different regions, as shown in a parallel-to-gate (PGD) view of FIG. 6D showing a grain size/grain boundary difference between the different material layers. Numerous variations and configurations will be apparent in light of this disclosure.

Thus, according the differential trench fill process of the disclosed embodiments, a single patterning process can be used to achieve uniform open density, uniform overburden and essentially uniform pattern density regardless of the number of different open density regions.

Figure 6A:
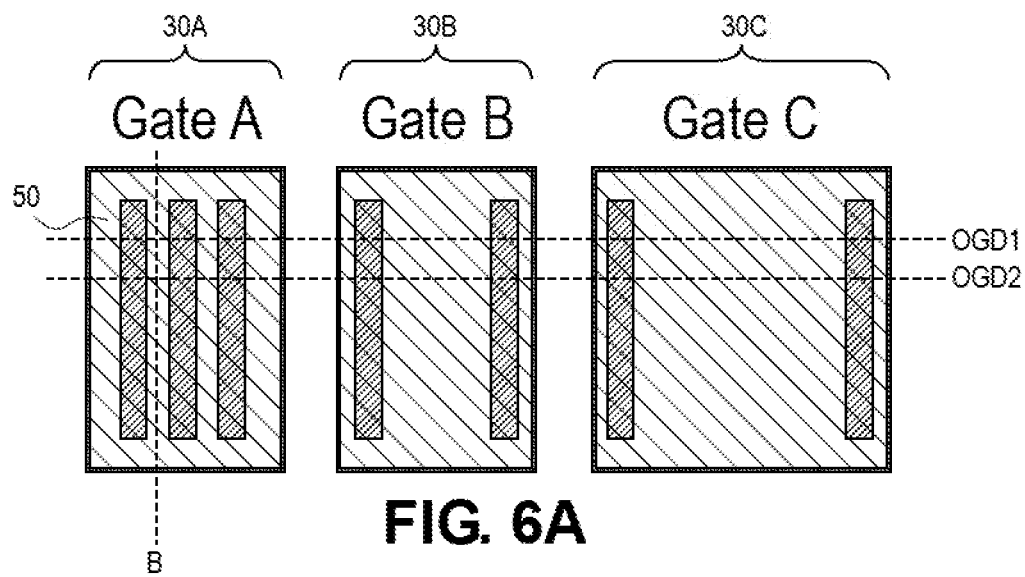
FIGS. 6A-6D are diagrams illustrating cross-section views of the IC showing the differential trench fill fabrication process after the gate regions are polished.
Figure 6B:
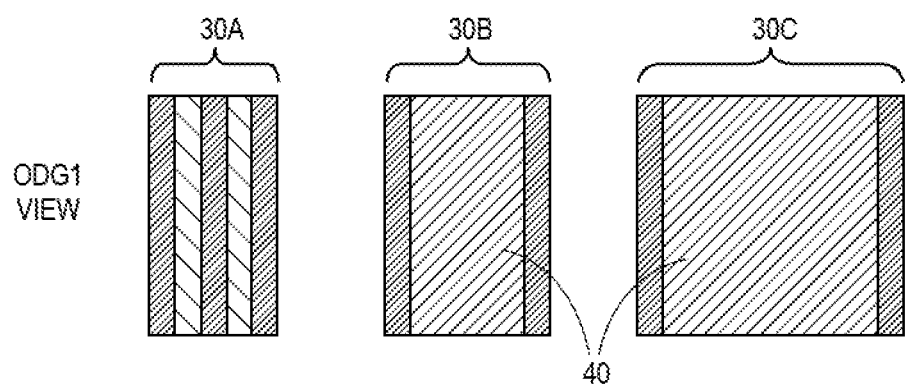
Figure 6C:
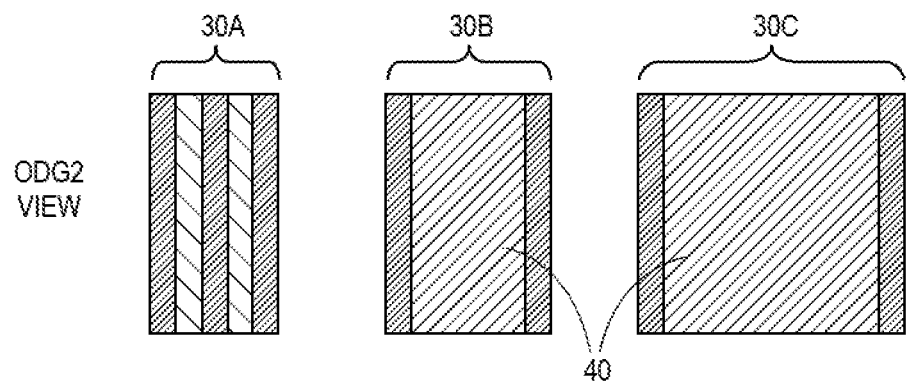
Figure 6D:
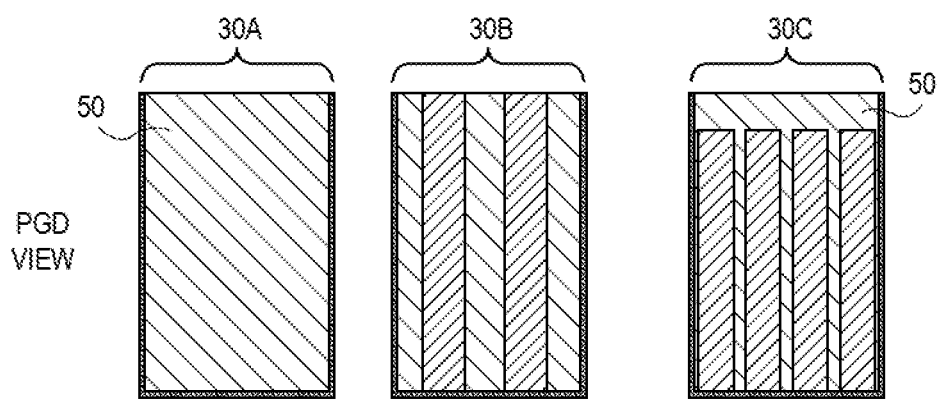

FIGS. 6A-6D are diagrams illustrating cross-section views of the IC showing the differential trench fill fabrication process after the gate regions are polished, e.g., by CMP. As shown in FIGS. 6B and 6C, the differential trench fill process results in substantial uniform planarity across the open density regions 30A, 30B and 30C and substantial uniform gate height.

The differential trench fill process may also be used in the back end stack for fabricating interconnects after transistor fabrication to form metal routing in the intended pattern of the interconnects creates regions with different open density. In one embodiment, the differential trench fill process deposits the first fill material 40 and the second fill material 50 using chemical vapor deposition (CVD) or atomic layer deposition (ALD).

The integrated circuit structures described herein may be included in an electronic device. As an example of one such apparatus, FIGS. 7A and 7B are top views of a wafer and dies that include one or more ICs having a differential trench fill, in accordance with one or more of the embodiments disclosed herein.

Figure 7B:
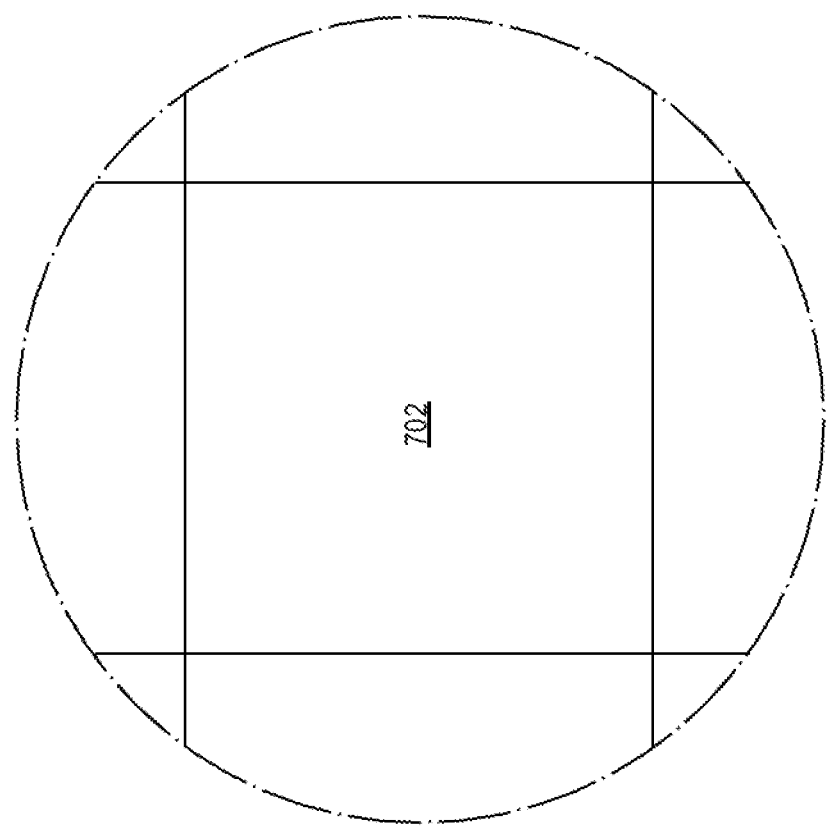
FIGS. 7A and 7B are diagrams of top views of a wafer and dies that include one or more ICs having a differential trench fill, in accordance with one or more of the embodiments disclosed herein.
Figure 7A:
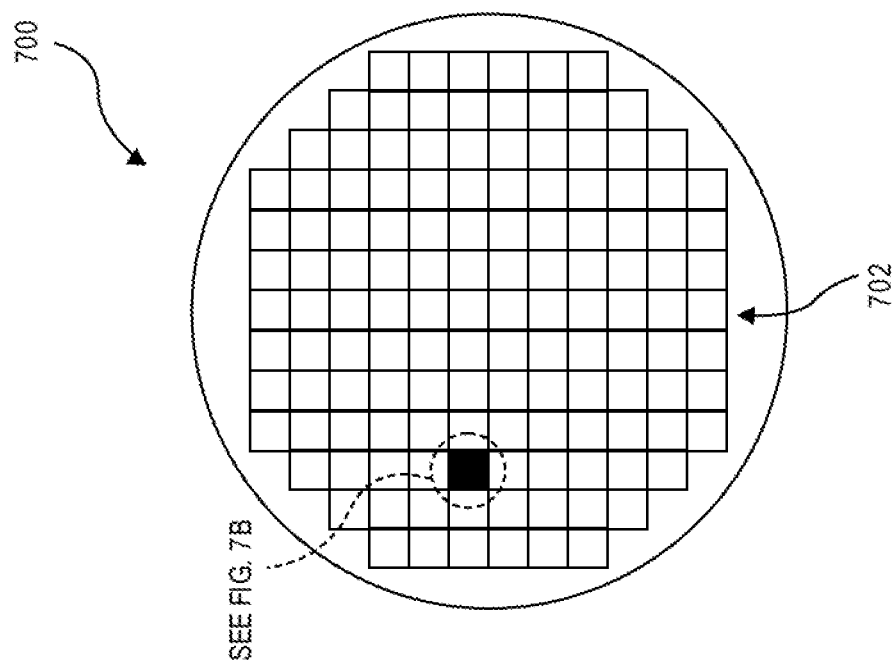

Referring to FIGS. 7A and 7B, a wafer 700 may be composed of semiconductor material and may include one or more dies 702 having integrated circuit (IC) structures formed on a surface of the wafer 700. Each of the dies 702 may be a repeating unit of a semiconductor product that includes any suitable IC having a differential trench fill, such as described above. After the fabrication of the semiconductor product is complete, the wafer 700 may undergo a singulation process in which each of the dies 702 is separated from one another to provide discrete "chips" of the semiconductor product. In particular, structures that include embedded non-volatile memory structures having an independently scaled selector as disclosed herein may take the form of the wafer 700 (e.g., not singulated) or the form of the die 702 (e.g., singulated). The die 702 may include one or more embedded non-volatile memory structures based independently scaled selectors and/or supporting circuitry to route electrical signals, as well as any other IC components. In some embodiments, the wafer 700 or the die 702 may include an additional memory device (e.g., a static random access memory (SRAM) device), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
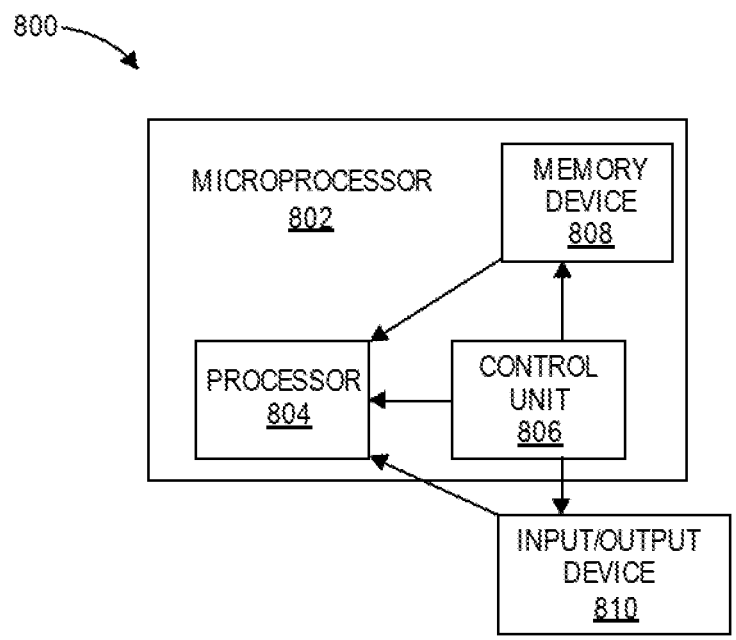
FIG. 8 illustrates a block diagram of an electronic system, in accordance with an embodiment of the present disclosure.

FIG. 8 illustrates a block diagram of an electronic system 800, in accordance with an embodiment of the present disclosure. The electronic system 800 can correspond to, for example, a portable system, a computer system, a process control system, or any other system that utilizes a processor and an associated memory. The electronic system 800 may include a microprocessor 802 (having a processor 804 and control unit 806), a memory device 808, and an input/output device 810 (it is to be appreciated that the electronic system 800 may have a plurality of processors, control units, memory device units and/or input/output devices in various embodiments). In one embodiment, the electronic system 800 has a set of instructions that define operations which are to be performed on data by the processor 804, as well as, other transactions between the processor 804, the memory device 808, and the input/output device 810. The control unit 806 coordinates the operations of the processor 804, the memory device 808 and the input/output device 810 by cycling through a set of operations that cause instructions to be retrieved from the memory device 808 and executed. The memory device 808 can include a non-volatile memory cell as described in the present description. In an embodiment, the memory device 808 is embedded in the microprocessor 802, as depicted in FIG. 8. In an embodiment, the processor 804, or another component of electronic system 800, includes one or more ICs having a differential trench fill, such as those described herein.

Figure 9:
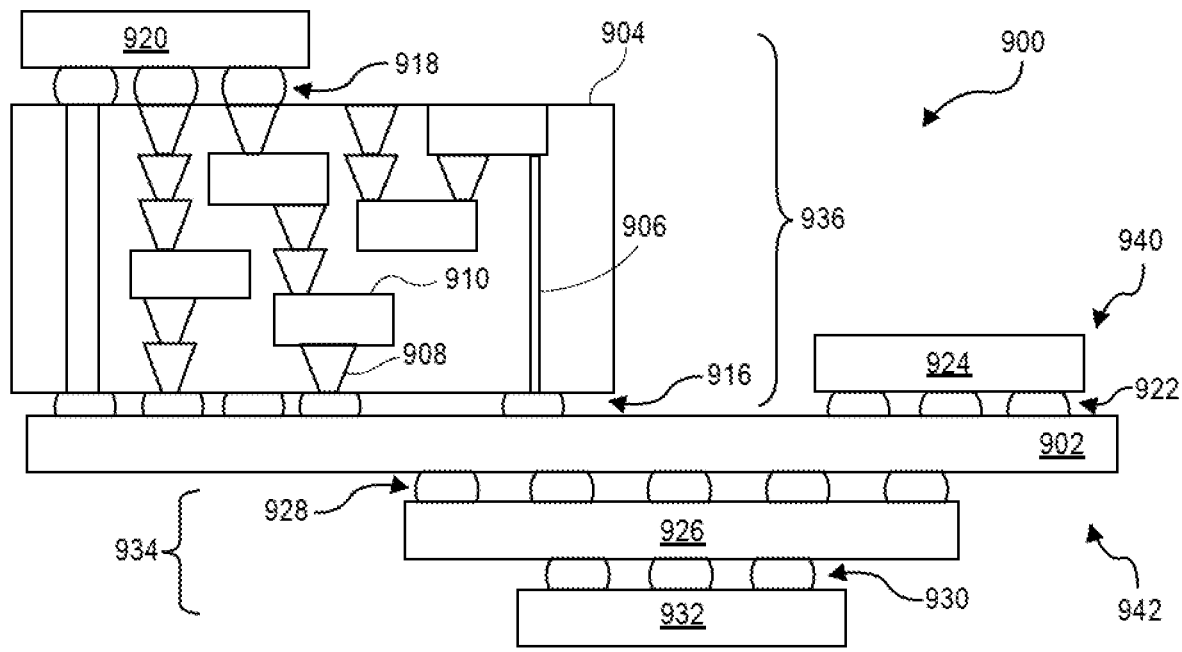
FIG. 9 is a cross-sectional side view of an integrated circuit (IC) device assembly that may include one or more ICs having a differential trench fill, in accordance with one or more of the embodiments disclosed herein.

FIG. 9 is a diagram of cross-sectional side view of an integrated circuit (IC) device assembly that may include one or more ICs having a differential trench fill, in accordance with one or more of the embodiments disclosed herein.

Referring to FIG. 9, an IC device assembly 900 includes components having one or more integrated circuit structures described herein. The IC device assembly 900 includes a number of components disposed on a circuit board 902 (which may be, e.g., a motherboard). The IC device assembly 900 includes components disposed on a first face 940 of the circuit board 902 and an opposing second face 942 of the circuit board 902. Generally, components may be disposed on one or both faces 940 and 942. In particular, any suitable ones of the components of the IC device assembly 900 may include a number of ICs having a differential trench fill, such as disclosed herein.

In some embodiments, the circuit board 902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate.

The IC device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), male and female portions of a socket, an adhesive, an underfill material, and/or any other suitable electrical and/or mechanical coupling structure.

The package-on-interposer structure 936 may include an IC package 920 coupled to an interposer 904 by coupling components 918. The coupling components 918 may take any suitable form for the application, such as the forms discussed above with reference to the coupling components 916. Although a single IC package 920 is shown in FIG. 9, multiple IC packages may be coupled to the interposer 904. It is to be appreciated that additional interposers may be coupled to the interposer 904. The interposer 904 may provide an intervening substrate used to bridge the circuit board 902 and the IC package 920. The IC package 920 may be or include, for example, a die (the die 702 of FIG. 7B), or any other suitable component. Generally, the interposer 904 may spread a connection to a wider pitch or reroute a connection to a different connection. For example, the interposer 904 may couple the IC package 920 (e.g., a die) to a ball grid array (BGA) of the coupling components 916 for coupling to the circuit board 902. In the embodiment illustrated in FIG. 9, the IC package 920 and the circuit board 902 are attached to opposing sides of the interposer 904. In other embodiments, the IC package 920 and the circuit board 902 may be attached to a same side of the interposer 904. In some embodiments, three or more components may be interconnected by way of the interposer 904.

The interposer 904 may be formed of an epoxy resin, a fiberglass-reinforced epoxy resin, a ceramic material, or a polymer material such as polyimide. In some implementations, the interposer 904 may be formed of alternate rigid or flexible materials that may include the same materials described above for use in a semiconductor substrate, such as silicon, germanium, and other group III-V and group IV materials. The interposer 904 may include metal interconnects 910 and vias 908, including but not limited to through-silicon vias (TSVs) 906. The interposer 904 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The IC device assembly 900 may include an IC package 924 coupled to the first face 940 of the circuit board 902 by coupling components 922. The coupling components 922 may take the form of any of the embodiments discussed above with reference to the coupling components 916, and the IC package 924 may take the form of any of the embodiments discussed above with reference to the IC package 920.

The IC device assembly 900 illustrated in FIG. 9 includes a package-on-package structure 934 coupled to the second face 942 of the circuit board 902 by coupling components 928. The package-on-package structure 934 may include an IC package 926 and an IC package 932 coupled together by coupling components 930 such that the IC package 926 is disposed between the circuit board 902 and the IC package 932. The coupling components 928 and 930 may take the form of any of the embodiments of the coupling components 916 discussed above, and the IC packages 926 and 932 may take the form of any of the embodiments of the IC package 920 discussed above. The package-on-package structure 934 may be configured in accordance with any of the package-on-package structures known in the art.

Figure 10:
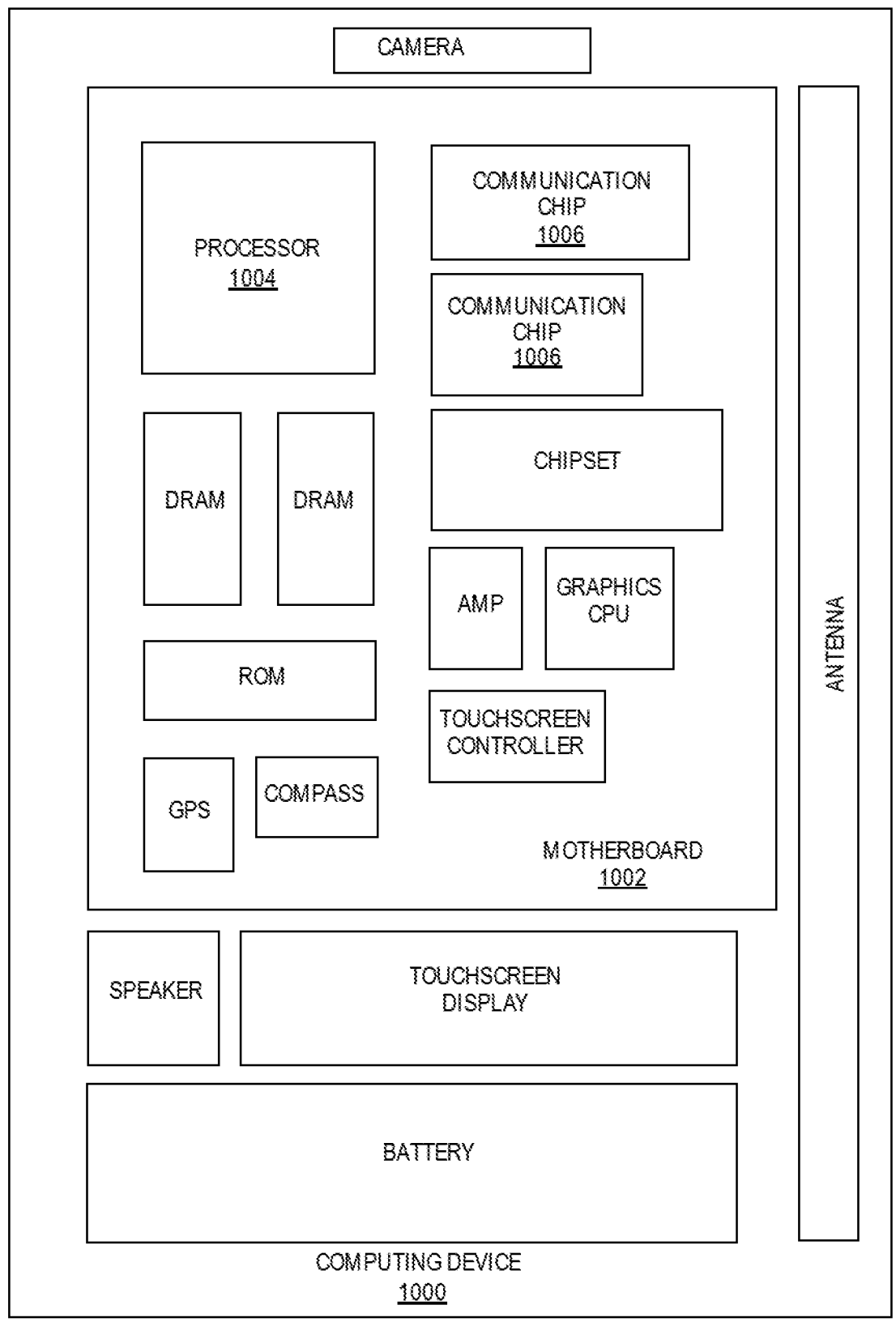
FIG. 10 illustrates a computing device in accordance with one implementation of the disclosure.

FIG. 10 illustrates a computing device 1000 in accordance with one implementation of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the disclosure, the integrated circuit die of the processor includes one or more ICs having a differential trench fill, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the disclosure, the integrated circuit die of the communication chip includes one or more ICs having a differential trench fill, in accordance with implementations of embodiments of the disclosure.

In further implementations, another component housed within the computing device 1000 may contain an integrated circuit die that includes one or more ICs having a differential trench fill, in accordance with implementations of embodiments of the disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments described herein include ICs having a differential trench fill.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a plurality of structures above a substrate, wherein spacing between the structures creates a range of different open density regions from a relatively low open density region to a high open density region. A first fill material fills at least a portion of openings between the structures in at least the high open density region to provide a substantially uniform open density across the different open density regions, wherein the first fill material is patterned to include openings therein. A second fill material fills the openings between the structures in the low open density region, and fills the openings in the first fill material in the at least the high open density region. The structures filled with the second fill material in the low open density region and the structures filled with both the first fill material and the second fill material in the high open density region are substantially planar at a desired final height.

Example Embodiment 2

The integrated circuit structure of example embodiment 1, wherein the IC includes a first set of structures having a low open density region, a second set of structures having a medium open density region, and a third set of structures corresponding to the high open density region.

Example Embodiment 3

The integrated circuit structure of example embodiment 1 or 2, wherein the first fill material is deposited over any of the open density regions having an open density of at least 50%.

Example Embodiment 4

The integrated circuit structure of example embodiment 1, 2 or 3, wherein the first fill material is patterned to fill at least a portion of openings between the structures in the medium open density region and the high open density region.

Example Embodiment 5

The integrated circuit structure of example embodiment 1, 2, 3 or 4, wherein the second fill material fills the openings in both the first fill material in the medium open density region and the high density region.

Example Embodiment 6

The integrated circuit structure of example embodiment 1, 2, 3, 4 or 5, wherein, the first fill material is patterned into parallel spaced strips formed across the openings formed by the structures.

Example Embodiment 7

The integrated circuit structure of example embodiment 1, 2, 3, 4, 5 or 6, wherein the first fill material and the second fill material are tuned to provide the same final height for the structures in the different open density regions.

Example Embodiment 8

The integrated circuit structure of example embodiment 1, 2, 3, 4, 5 or 6, wherein the first fill material and the second fill material are tuned to provide different final heights for the structures in the different open density regions.

Example Embodiment 9

The integrated circuit structure of example embodiment 1, 2, 3, 4, 5, 6, 7 or 8, wherein the structures comprise spacers that define gate regions, wherein the first fill material and the second fill material comprise a conductive fill material, and wherein the spacers, the first fill material and the second fill material are substantially planar and 50-300 nm in height.

Example Embodiment 10

The integrated circuit structure of example embodiment 1, 2, 3, 4, 5, 6, 7, 8, or 9, wherein the first fill material and the second fill material comprise a non-conductive material.

Example Embodiment 11

The integrated circuit structure of example embodiment 1, 2, 3, 4, 5, 6, 7, 8, 9 or 10, wherein the first fill material and the second fill material comprise a same material.

Example Embodiment 12

The integrated circuit structure of example embodiment 1, 2, 3, 4, 5, 6, 7, 8, 9 or 10, wherein the first fill material and the second fill material comprise a different material.

Example Embodiment 13

An integrated circuit structure comprises a plurality of spacers above a substrate, wherein spacing between the spacers creates a range of different open density regions including a low open density region, a medium open density region and a high open density region. A first conductive fill material fills at least a portion of trenches formed between the spacers in the medium open density region and the high open density region to provide a substantially uniform open density across the different open density regions. A second conductive fill material fills trenches between the spacers in the low open density region, the second conductive fill material further fills the trenches in the first conductive fill material in both the medium open density region and in the high open density region. The spacers and the second conductive fill material in the low open density regions, and the spacers and the first conductive fill material and the second conductive fill material in both the medium open density region and the high open density region are substantially planar at a desired final height.

Example Embodiment 14

The integrated circuit structure of example embodiment 13, wherein the first conductive fill material is deposited over any of the open density regions having an open density of at least 50%.

Example Embodiment 15

The integrated circuit structure of example embodiment 13 or 14, wherein, the first conductive fill material is patterned into parallel spaced strips across the trenches between the spacers.

Example Embodiment 16

The integrated circuit structure of example embodiment 13, 14 or 15, wherein the first conductive fill material and the second conductive fill material are tuned to provide the same final height for the spacers in the different open density regions.

Example Embodiment 17

The integrated circuit structure of example embodiment 13, 14, 15 or 16, wherein the first conductive fill material and the second conductive fill material are tuned to provide different final heights for the spacers in the different open density regions.

Example Embodiment 18

The integrated circuit structure of example embodiment 13, 14, 15, 16 or 17, wherein the spacers define gate regions.

Example Embodiment 19

The integrated circuit structure of example embodiment 13, 14, 15, 16, 17 or 18, wherein the spacers, the first conductive fill material and the second conductive fill material are substantially planar and 50-300 nm in height.

Example Embodiment 20

The integrated circuit structure of example embodiment 13, 14, 15, 16, 17, 18 or 19, wherein the first conductive fill material and the second conductive fill material comprise a non-conductive material.

Example Embodiment 21

The integrated circuit structure of example embodiment 13, 14, 15, 16, 17, 18 or 19, wherein the first conductive fill material and the second conductive fill material comprise a same material.

Example Embodiment 22

The integrated circuit structure of example embodiment 13, 14, 15, 16, 17, 18 or 19, wherein the first conductive fill material and the second conductive fill material comprise a different material.

Example Embodiment 23

A method of fabricating an integrated circuit (IC) device comprises forming a plurality of structures above a substrate, wherein spacing between the structures creates a range of different open density regions from relatively low open density regions to high open density regions. A first fill material is formed that fills at least a portion of openings between the structures in at least the high open density region to provide a substantially uniform open density across the different open density regions, wherein the first fill material is patterned to include openings therein. A second fill material is formed that fills the openings between the structures in the low open density region, and forming the second fill material in the openings in the first fill material in the at least the high open density region, wherein the structures filled with the second fill material in the low open density regions and the structures filled with both the first fill material and the second fill material in the high open density region are substantially planar at a desired final height.

Example Embodiment 24

The method of claim 23, wherein forming a first fill material further comprises: using a single patterning process to deposit and etch the first fill material differently in the different open density regions to form different patterns.

Example Embodiment 25

The method of claim 23, wherein forming a first fill material further comprises: etching the first fill material such that an increasingly larger amount of the first fill material is patterned over increasingly higher open density regions.

What is claimed is:
1. An integrated circuit structure, comprising:
a plurality of structures above a substrate, wherein spacing between the structures creates a range of different open density regions from a relatively low open density region to a high open density region;
a first fill material filling at least a portion of openings between the structures in at least the high open density region to provide a substantially uniform open density across the different open density regions, wherein the first fill material is patterned to include openings therein; and
a second fill material filling the openings between the structures in the low open density region, and filling the openings in the first fill material in the at least the high open density region,
wherein the structures filled with the second fill material in the low open density region and the structures filled with both the first fill material and the second fill material in the high open density region are substantially planar at a desired final height.

2. The integrated circuit structure of claim 1, wherein the integrated circuit structure includes a first set of structures having a low open density region, a second set of structures having a medium open density region, and a third set of structures corresponding to the high open density region.

3. The integrated circuit structure of claim 2, wherein the first fill material is deposited over any of the open density regions having an open density of at least 50%.

4. The integrated circuit structure of claim 3, wherein the first fill material is patterned to fill at least a portion of openings between the structures in the medium open density region and the high open density region.

5. The integrated circuit structure of claim 3, wherein the second fill material fills the openings in both the first fill material in the medium open density region and the high open density region.

6. The integrated circuit structure of claim 1, wherein, the first fill material is patterned into parallel spaced strips formed across the openings formed by the structures.

7. The integrated circuit structure of claim 1, wherein the first fill material and the second fill material are tuned to provide the same final height for the structures in the different open density regions.

8. The integrated circuit structure of claim 1, wherein the first fill material and the second fill material are tuned to provide different final heights for the structures in the different open density regions.

9. The integrated circuit structure of claim 1, wherein the structures comprise spacers that define gate regions, wherein the first fill material and the second fill material comprise a conductive fill material, and wherein the spacers, the first fill material and the second fill material are substantially planar and 50-300 nm in height.

10. The integrated circuit structure of claim 1, wherein the first fill material and the second fill material comprise a non-conductive material.

11. The integrated circuit structure of claim 1, wherein the first fill material and the second fill material comprise a same material.

12. The integrated circuit structure of claim 1, wherein the first fill material and the second fill material comprise a different material.

13. An integrated circuit structure, comprising:
a plurality of spacers above a substrate, wherein spacing between the spacers creates a range of different open density regions including a low open density region, a medium open density region and a high open density region;
a first conductive fill material filling at least a portion of trenches formed between the spacers in the medium open density region and the high open density region to provide a substantially uniform open density across the different open density regions; and a second conductive fill material filling trenches between the spacers in the low open density region, the second conductive fill material further filling the trenches in the first conductive fill material in both the medium open density region and in the high open density region;

wherein the spacers and the second conductive fill material in the low open density region, and the spacers and the first conductive fill material and the second conductive fill material in both the medium open density region and the high open density region are substantially planar at a desired final height.

14. The integrated circuit structure of claim 13, wherein the first conductive fill material is deposited over any of the open density regions having an open density of at least 50%.

15. The integrated circuit structure of claim 13, wherein, the first conductive fill material is patterned into parallel spaced strips across the trenches between the spacers.

16. The integrated circuit structure of claim 13, wherein the first conductive fill material and the second conductive fill material are tuned to provide the same final height for the spacers in the different open density regions.

17. The integrated circuit structure of claim 13, wherein the first conductive fill material and the second conductive fill material are tuned to provide different final heights for the spacers in the different open density regions.

18. The integrated circuit structure of claim 13, wherein the spacers define gate regions.

19. The integrated circuit structure of claim 13, wherein the spacers, the first conductive fill material and the second conductive fill material are substantially planar and 50-300 nm in height.

20. The integrated circuit structure of claim 13, wherein the first conductive fill material and the second conductive fill material comprise a non-conductive material.

21. The integrated circuit structure of claim 13, wherein the first conductive fill material and the second conductive fill material comprise a same material.

22. The integrated circuit structure of claim 13, wherein the first conductive fill material and the second conductive fill material comprise a different material.

23. A method of fabricating an integrated circuit (IC) device, the method comprising:

forming a plurality of structures above a substrate, wherein spacing between the structures creates a range of different open density regions from a relatively low open density region to a high open density region;

forming a first fill material that fills at least a portion of openings between the structures in at least the high open density region to provide a substantially uniform open density across the different open density regions, wherein the first fill material is patterned to include openings therein; and forming a second fill material that fills the openings between the structures in the low open density region, and forming the second fill material in the openings in the first fill material in the at least the high open density region, wherein the structures filled with the second fill material in the low open density region and the structures filled with both the first fill material and the second fill material in the high open density region are substantially planar at a desired final height.

24. The method of claim 23, wherein forming a first fill material further comprises: using a single patterning process to deposit and etch the first fill material differently in the different open density regions to form different patterns.

25. The method of claim 23, wherein forming a first fill material further comprises: etching the first fill material such that an increasingly larger amount of the first fill material is patterned over increasingly higher open density regions.

* * * * *